United States Patent [19]

Loughry

[11] Patent Number: 5,327,091
[45] Date of Patent: Jul. 5, 1994

[54] ELECTRONIC MODE STIRRING

[75] Inventor: Thomas A. Loughry, Connellsville, Pa.

[73] Assignee: The United States of America as represented by the Secretary of the Air Force, Washington, D.C.

[21] Appl. No.: 27,046

[22] Filed: Mar. 4, 1993

[51] Int. Cl.$^5$ .............................................. G01R 27/00
[52] U.S. Cl. .................................... 324/627; 324/603; 324/613; 324/633; 324/636
[58] Field of Search ............... 324/603, 627, 613, 633, 324/636

[56] References Cited

U.S. PATENT DOCUMENTS

| | | |
|---|---|---|
| H821 | 9/1990 | Hatfield .............................. 324/627 |
| 2,919,215 | 12/1959 | Neuhaus et al. . |
| 3,495,807 | 2/1970 | Shields et al. . |
| 3,614,069 | 10/1971 | Murry . |
| 3,720,402 | 3/1973 | Cummins et al. . |
| 4,733,165 | 3/1988 | Richardson .......................... 324/636 |
| 4,941,134 | 7/1990 | Nyberg et al. . |

Primary Examiner—Kenneth A. Wieder
Assistant Examiner—Jose M. Solis
Attorney, Agent, or Firm—Donald J. Singer; Irwin P. Garfinkle

[57] ABSTRACT

A device under test is placed in a metallic reverberation chamber and test are run for various characteristics. An antenna positioned in the chamber radiates microwave energy into the chamber. There is disclosed a method of frequency stirring which uses band limited White Gaussian noise (WGN) up-converted by performing double sideband, suppressed carrier modulation with a microwave signal from a synthesized sweeper. The output is then amplified with a TWT amplifier to meet the higher power level requirements. The synthesized sweeper is used to generate the monochromatic signal which determines the center frequency of the output while the WGN source and low pass filters provide the frequency agility.

6 Claims, 2 Drawing Sheets

ELECTRONIC MODE STIRRING

STATEMENT OF GOVERNMENT INTEREST

The invention described herein may be manufactured and used by or for the Government for governmental purposes without the payment of any royalty thereon.

FIELD OF THE INVENTION

This invention relates to a method and apparatus for electronic mode stirring and is designed to eliminate the mechanical paddle wheel normally used when conducting electromagnetic susceptibility testing in a reverberation chamber. The technique involves up-converting band limited white Gaussian noise to microwave frequencies and achieves the advantage of a shortened test time (by a factor of 100 in some cases). The invention has application in upset testing, measuring coupling cross section, and measuring shielding effectiveness.

BACKGROUND OF THE INVENTION

The conventional method of reverberation chamber testing uses a large metallic paddle wheel to mix or stir the fields within the chamber. This ensures that the test object will be exposed to the maximum field values in the chamber. The frequencies at which eigenmodes can exist in a rectangular cavity of dimensions a, b, and d are:

$$f_{mnl} = \frac{C}{2Pi\sqrt{u_r \epsilon_r}} \sqrt{\left(\frac{mPi}{a}\right)^2 + \left(\frac{nPi}{b}\right)^2 + \left(\frac{lPi}{d}\right)^2};$$

where:
C = the speed of light
m, n and l are integers
$u_r$ = relative permeability
$C_r$ = relative permeability There has been an increasing interest in the use of mode tuned or stirred reverberation chambers for conducting electromagnetic coupling and upset experiments. Mode stir-chambers consist of a high quality factor metallic reverberation chamber in which a stirring device such as a metallic paddle wheel is used to incrementally or continuously alter the boundary conditions within the chamber. The goal is to achieve an isotopic homogeneous field everywhere within the volume of the cavity except near the walls. Field homogeneity is achieved in this manner by exploiting the pseudo-statistical nature of each of the eigenfunction's contribution to the field level at a given point within the chamber volume. Extensive work has been done at the National Institute of Standards and Technology (NIST) and at the Naval Surface Weapons Center to both optimize chamber design and characterize chamber fields. Field uniformities of less than +3 dB above 1 GHz and less that +2 dB above 2 GHz have been achieved in a 2.74×3/05×4.75 m welded steel enclosure using the paddle wheel technique.

Reverberation chamber testing offers several advantages over anechoic or plane wave illumination testing. For example, E-field levels in the thousands of volts per meter can be achieved using relatively low power sources such as 200 watt TWT amplifiers. Coupling cross sections can be measured independent of the angle of incidence, and this is particularly beneficial when testing subsystems that would normally exist inside an equipment bay or cavity. On the other hand, dependence on mechanical mode stirring can complicate data acquisition and interpretation as well as require long periods of time (sometimes as much as ten hours per test) to acquire a complete data set. These complication are primarily due to the requirement that the data be measured for many differ positions of the paddle wheel for each frequency and power level because field uniformity inside the volume of the chamber can only be obtained by averaging the fields influenced by each position of the tuner over many positions. Hence, real time field uniformity can only exist on time scales of the same order as the paddle wheel rotation rate.

This invention uses electronic mode stirring in a reverberation chamber to perform both coupling and upset testing. While the conventional method of mode stirring holds the frequency constant and varies the cavity's boundary conditions in order to obtain a sufficiently large sample of eigenfunction contributions to the field levels at a given point in the chamber, the method described here does not vary boundary conditions, but instead averages the eigenfuctions's contributions over a narrow band of frequency.

In mechanical mode stirring, these resonant frequencies are perturbed or stirred by shape perturbations. The degree to which the shape of the cavity can be perturbed is related to the size and number of paddle wheels as well as other physical characteristics such as the relative angle of the paddle vanes. The advantages of this technique over the conventional paddle wheel system and method include shorter test times, simplified data acquisition and control, and more interpretable results. The invention was reduced to practice with good results, once using a reverberation chamber with dimensions of 6×4×5 feet, and in a second chamber with dimensions of 3×3×3 feet.

PRIOR PATENTS

The follow U.S. patents were found in a search of the prior art:
U.S. Pat. No. 4,941,134, issued to Nyberg et al;
U.S. Pat. No. 3,720,402, issued to Cummins et al;
U.S. Pat. No. 3,614,069, issued to Murry;
U.S. Pat. No. 3,495,807, issued to Shields et al; and
U.S. Pat. No. 2,919,215, issued to Neuhauso Nyberg et al disclose a sonic generator comprising a resonant bar which is immersed in a fluid medium and transmits energy thereto. Magnetic excitation of the resonant bar causes a three dimensional, nutational vibration which allows acoustic energy to propagate radially off of the resonant bar in all directions.

Cummins et al are cited to show that it is known that certain crystals, e.g., barium titanate, when excited with an electrical current, vibrate at a frequency above about 20 khz and electrical current, vibrate at a frequency above about 20 khz and that a standing wave may be established in a liquid within a vessel to which such an excited crystal is connected.

Murry discloses a method and apparatus for improved cavitation, emulsification and mixing which subjects material to grow, collapse and implode.

Shields et al are concerned with the homogenization of milk and toward this end utilize a device similar to that of Nyberg et al. Shields et al disclose a casing that contains a probe at one end connected to means at the other end for inducing longitudinal vibrations in the probe at sonic or ultrasonic frequencies.

Neuhaus et al relate to apparatus for vibrating liquids wherein the vibrations are transmitted to the liquid through the walls of the vessel containing the liquid by lines of force of magnetic or electric fields. A preferred teaching relates to a system wherein the frequencies are in resonance.

While the disclosures of the aforementioned patents are aimed at the frequency stir method, they fail to disclose the use of band limited White Gaussian Noise up-converted in a manner as taught herein.

SUMMARY OF THE INVENTION

The frequency (electronic) stir method excites many resonant frequencies simultaneously over a narrow frequency band centered at the frequency of interest. In accordance with this invention the method of frequency stirring uses band limited White Gaussian noise (WGN) up-converted by performing double sideband, suppressed carrier modulation with an RF signal from a synthesized sweeper. The output is then amplified with a TWT amplifier to meet the higher power level requirements. The synthesized sweeper is used to generate the monochromatic signal which determines the center frequency of the output while the WGN source and low pass filters provide the frequency agility.

OBJECTS OF THE INVENTION

It is an object of this invention to provide a system and method for electronic mode stirring and thereby eliminate the inherent limitations associated with mechanically mode stirred reverberation chambers.

Another object of this invention is to provide homogeneous fields in a reverberation chamber without the use of a mechanical stirrer.

Another object of this invention is to provide a frequency (electronic) stir method that excites many resonant frequencies simultaneously over a narrow frequency band centered at a frequency of interest.

Still another object of this invention is to provide a frequency stirring method which uses band limited White Gaussian noise (WGN) up-converted by performing double sideband, suppressed carrier modulation with an RF signal from a synthesized sweeper.

Yet another object of this invention is to provide an electronic mode stirring method and system in which is generated a monochromatic signal which determines the center frequency of the output to a reverberation chamber while a white gaussin noise source and low pass filters are used to provide frequency agility.

BRIEF DESCRIPTION OF THE DRAWINGS

These and other advantages, objects and features of the invention will become more apparent after considering the following description taken in conjunction with the illustrative embodiment in the accompanying drawings, in which.

DESCRIPTION OF THE PREFERRED EMBODIMENT

Figure 1:
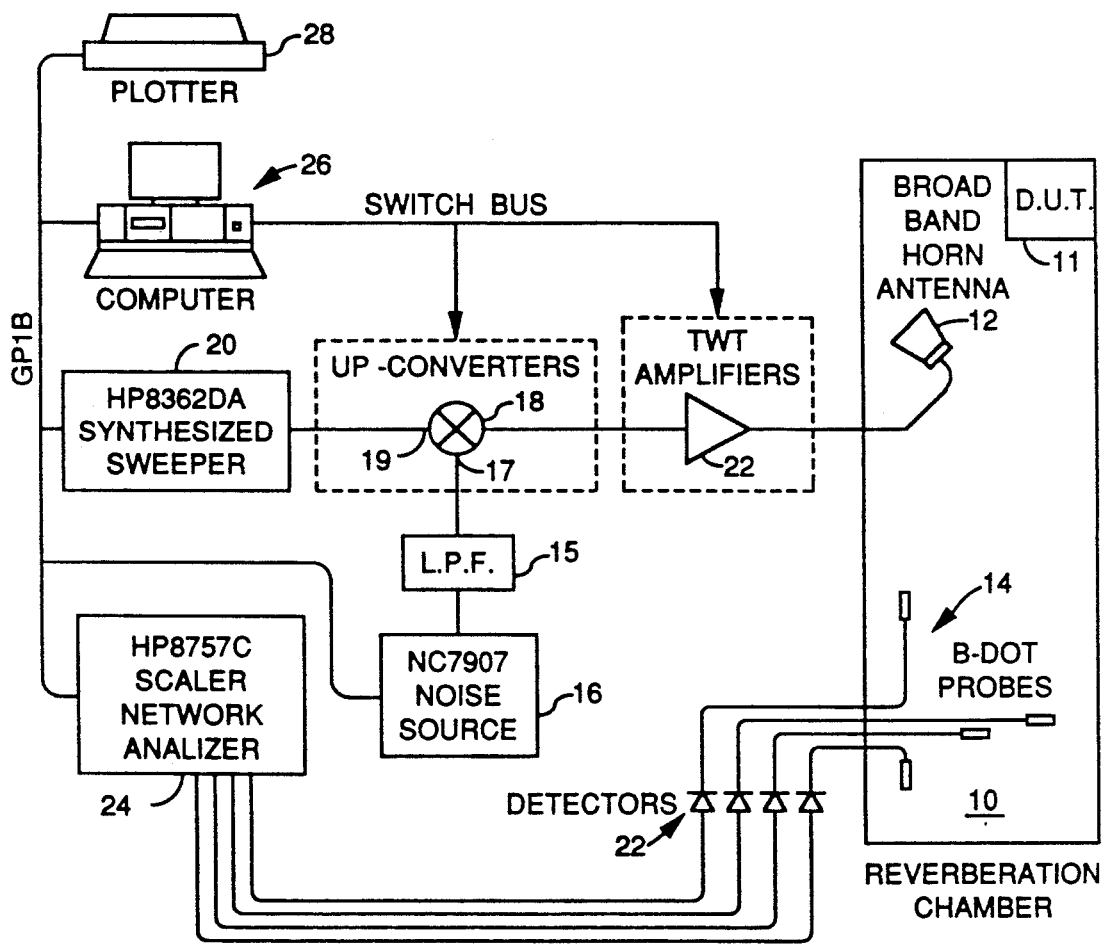
FIG. 1 illustrates an embodiment of the invention as reduced to practice.

The method and apparatus provided by this invention are illustrated in FIG. 1, which includes a reverberation chamber 10 in which a device under test (DUT) 11 is positioned. The device under test, the DUT 11 is exposed to microwave frequencies supplied by a broad band antenna 12, mounted within the chamber 10. A plurality of B-dot sensor probes 14 are also positioned within the chamber for the purpose of measuring the levels of the microwave radiation on the DUT 11.

The system provides microwave frequencies to the interior of the chamber 10 from a microwave synthesizer, by up-converting band limited white gaussian noise. The apparatus for supplying the microwave frequencies comprises a white gaussian noise source 16 which supplies band limited noise through a low pass filter 15 to the first input terminal 17 of an up-converter 18. The second terminal 19 of the up-converter 18 is supplied with microwave frequencies from a synthesizer frequency sweeper 20. The band limited white gaussian noise from the noise source 16 is up-converted by performing double sideband, suppressed carrier modulation with the RF signal from the synthesizer 20. The output from the up-converter 18 is then applied to the input terminal 21 of a TWT amplifier 22. The output of the amplifier 20 is applied through output terminal 23 to the broad band antenna 12, which radiates the energy into the chamber 10.

Measurements relative to the device under test are made with the B-dot probes 14, which are connected through diode detectors 22 to a network analyzer 24. The detected measurement are then stored in a computer 26, and may be displayed by a plotter 28.

Figure 2A:
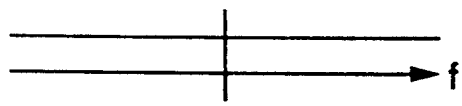
FIGS. 2a to 2d show the Frequency stir spectrum.
Figure 2B:
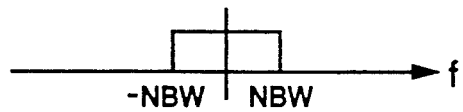
Figure 2C:
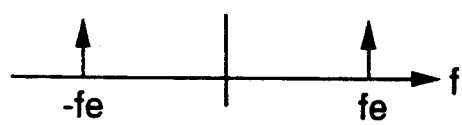
Figure 2D:
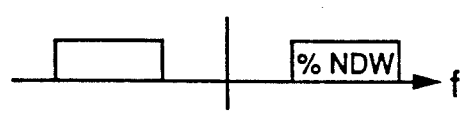
Figure 3A:
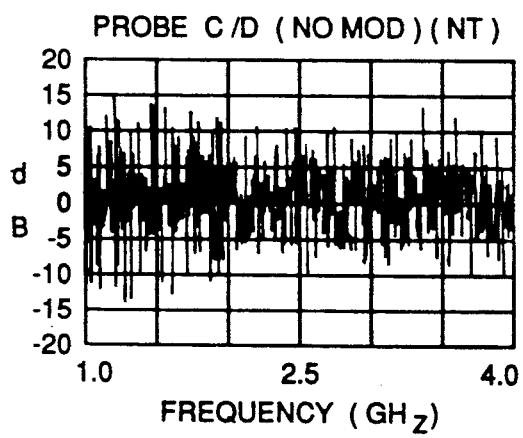
FIGS. 3a to 3d show the measured power ratio of the probes with an agility bandwidth of 0, 10, 50, and 100 MHz, respectively.
Figure 3B:
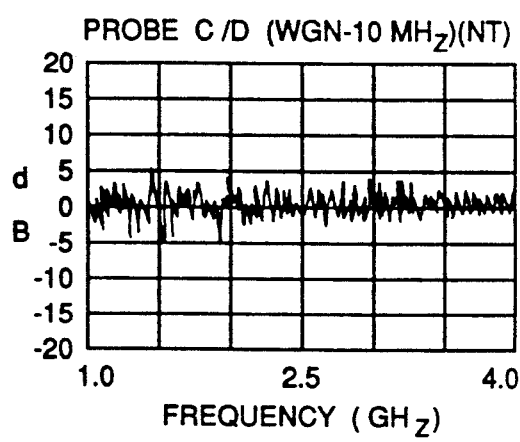
Figure 3C:
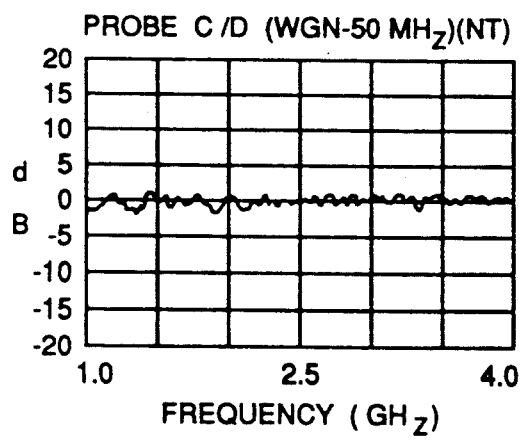
Figure 3D:
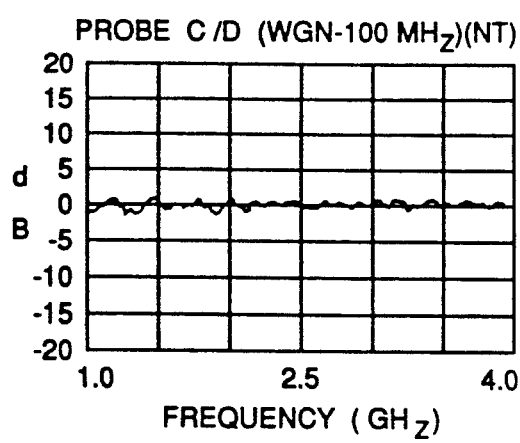

The nature of the signals is illustrated in FIGS. 2a to 2d. The output of the noise source is shown in FIG. 2a centered at a microwave frequency fo from the output of the synthesizer 20. The output of the low pass filter is shown in FIG. 2b as having a narrow bandwidth centered at frequency fo. The carrier frequency output of the sweeper is shown in FIG. 2c as centered at frequency fo, and sweeping from a start frequency to a stop frequency selected by the user. The up-converted output from the up-converter 18 is shown in FIG. 2d.

The system and method are provided for the purpose of conducting two tests, a coupling test and upset test.

In the coupling test the DUT is probed to measure the amount of energy that couples into it with a given power density in the reverberation chamber. The frequency is swept over a broad range (0.5-186 HZ) and the results are plotted as area Vs. frequency.

In the upset test, the center frequency and the noise band width are held constant, while the power is slowly increase until DUT failure.

FIGS. 3a-3d show the improvement in field homogeneity as the agility bandwidth of the white gaussian noise is increased from 10 to 100 MHz. This data represents the results for a relatively small enclosure.

Although the invention has been described with reference to a particular embodiment, it will be understood to those skilled in the art that the invention is capable of a variety of alternative embodiments within the spirit and scope of the appended claims.

What is claimed is:

1. An electronic mode stirrer for a device under test positioned in a reverberation chamber, the combination comprising:

a broad band antenna in said chamber;
a source of band limited white gaussian noise;
a source of swept carrier frequency;
means for up-converting said gaussian noise with said carrier frequency, and for suppressing said carrier to produce a narrow band of gaussian noise at the center frequency of said carrier; and means for supplying said narrow band of gaussian noise to said antenna.

2. The stirrer of claim 1 wherein said carrier frequency is in the microwave range of frequencies.

3. The stirrer of claim 2 wherein said carrier frequency is centered at a selected frequency and the power level of carrier frequency is increased until failure of the device under test.

4. A method of electronic stirring for a device under test in a reverberation chamber comprising the steps of:

generating a narrow band of white gaussian noise;

sweeping a source of carrier frequency over a broad band width and up-converting said narrow band of white gaussian noise to the center frequency of said carrier while suppressing said selected carrier frequency; and applying said up-converted white gaussian noise to the interior of said chamber.

5. The method of claim 4 wherein said carrier frequency is in the microwave range of frequencies.

6. The method of claim 5 wherein said carrier frequency is centered at a selected microwave frequency and the power level of the carrier source is increased until failure of the device under test.

* * * * *